(12) United States Patent
Tang

(10) Patent No.: US 12,336,168 B2
(45) Date of Patent: Jun. 17, 2025

(54) METHOD OF MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Yi Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 492 days.

(21) Appl. No.: 17/929,842

(22) Filed: Sep. 6, 2022

(65) Prior Publication Data

US 2023/0389279 A1 Nov. 30, 2023

(30) Foreign Application Priority Data

May 25, 2022 (CN) .......................... 202210583495.X

(51) Int. Cl.
*H01L 27/108* (2006.01)
*H10B 12/00* (2023.01)
(52) U.S. Cl.
CPC ............. *H10B 12/30* (2023.02); *H10B 12/03* (2023.02); *H10B 12/482* (2023.02); *H10B 12/488* (2023.02)
(58) Field of Classification Search
CPC ...... H10B 12/30; H10B 12/03; H10B 12/482; H10B 12/488; H10B 12/05; H10D 62/115; H10D 62/124
See application file for complete search history.

(56) References Cited

U.S. PATENT DOCUMENTS

| 10,535,659 | B2 | 1/2020 | Kim et al. |
| 11,563,005 | B2 | 1/2023 | Lee et al. |
| 2021/0183861 | A1* | 6/2021 | Lee ........................ H10B 12/03 |
| 2022/0208766 | A1* | 6/2022 | Kim ..................... H10B 12/488 |

FOREIGN PATENT DOCUMENTS

| CN | 109616474 A | 4/2019 |
| CN | 112992904 A | 6/2021 |

* cited by examiner

*Primary Examiner* — Mohammed R Alam
(74) *Attorney, Agent, or Firm* — Kilpatrick Townsend & Stockton LLP

(57) ABSTRACT

Embodiments of the present disclosure relate to the field of semiconductors, and provide a method of manufacturing a semiconductor structure and a semiconductor structure. The manufacturing method includes: providing a base, and forming active layers and sacrificial layers on the base, wherein two adjacent ones of the active layers constitute an active group, there is a first distance between the active layers in the active group, there is a second distance between adjacent ones of active groups, and the first distance is greater than the second distance; forming isolation layers, wherein each isolation layer penetrates through all the active layers and all the sacrificial layers, and the isolation layers divide each of the active layers into a plurality of active structures; removing a part of the isolation layers in the word line region and a part of the sacrificial layers located in the word line region.

15 Claims, 15 Drawing Sheets

METHOD OF MANUFACTURING SEMICONDUCTOR STRUCTURE AND SEMICONDUCTOR STRUCTURE

CROSS-REFERENCE TO RELATED APPLICATIONS

Figure 1:
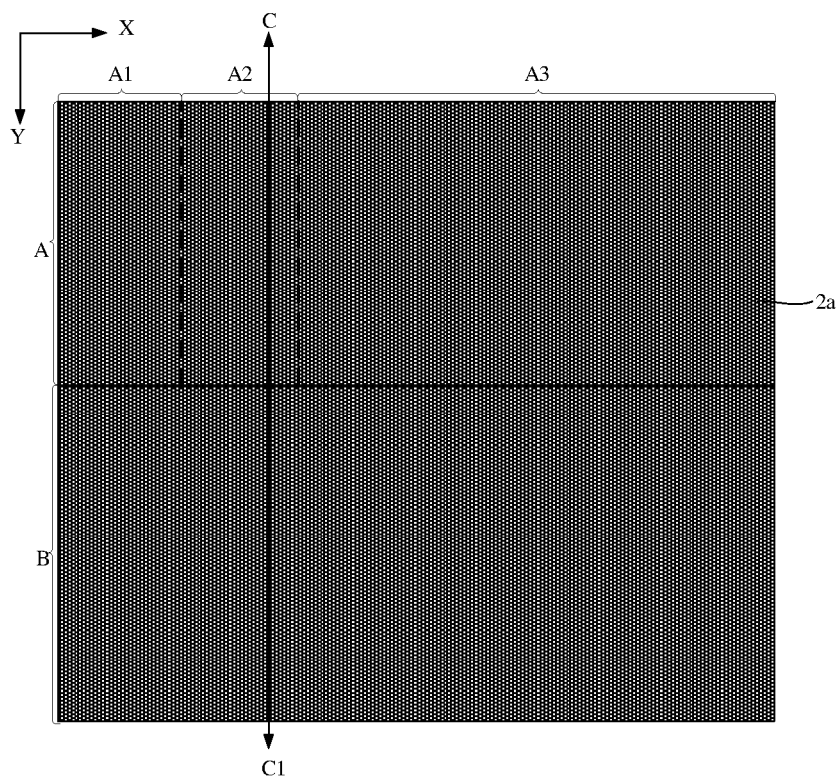

This application claims the priority of Chinese Patent Application No. 202210583495.X, submitted to the Chinese Intellectual Property Office on May 25, 2022, the disclosure of which is incorporated herein in its entirety by reference.

TECHNICAL FIELD

The present disclosure belongs to the field of semiconductors, and in particular, relates to a semiconductor structure and a manufacturing method thereof.

BACKGROUND

A dynamic random access memory (DRAM) is a semiconductor memory that operates mainly according to a principle of using a quantity of charges stored in a capacitor to represent whether a binary bit stored therein is 1 or 0.

A 3D stacked DRAM has a semiconductor structure in which a plurality of layers of transistors and a plurality of layers of capacitors are stacked on a base, and helps reduce costs per unit area due to its high level of integration. However, performance of the 3D stacked DRAM is still to be improved.

SUMMARY

According to some embodiments of the present disclosure, one aspect of the embodiments of the present disclosure provides a method of manufacturing a semiconductor structure, the semiconductor structure includes a bit line region, a word line region, and a capacitor region that are arranged in sequence in a first direction, and the manufacturing method includes: providing a base, and forming a plurality of active layers and a plurality of sacrificial layers on a part of the base in the bit line region, the word line region, and the capacitor region, wherein the active layers and the sacrificial layers are alternately stacked; two adjacent ones of the active layers constitute an active group; and there is a first distance between the active layers in the active group, there is a second distance between adjacent ones of active groups, and the first distance is greater than the second distance; forming a plurality of isolation layers, wherein each of the isolation layers penetrates through all the active layers and all the sacrificial layers, and the isolation layers divide each of the active layers into a plurality of active structures, and each of the isolation layers extends along the first direction; removing a part of the isolation layers in the word line region and a part of the sacrificial layers located in the word line region; forming a first dielectric layer in the word line region, wherein the first dielectric layer covers a surface of a part of the active layers and is located between parts of adjacent ones of the active structures in a same layer and between parts of adjacent ones of the active groups; and forming a plurality of word lines in the word line region, wherein each of the word lines is located between parts of the active layers in the active group, and each of the word lines crosses a plurality of active structures located in a same layer.

According to some embodiments of the present disclosure, another aspect of the embodiments of the present disclosure further provides a semiconductor structure, including a bit line region, a word line region, and a capacitor region arranged in sequence in a first direction, further including: a base; a plurality of active layers that are arranged at intervals stacked on a part of the base in the bit line region, the word line region, and the capacitor region, wherein two adjacent ones of the active layers constitute an active group, there is a first distance between the active layers in the active group, there is a second distance between adjacent ones of active groups, and the first distance is greater than the second distance; a plurality of isolation layers, wherein each of the isolation layers penetrates through all the active layers, and the isolation layers divide each of the active layers into a plurality of active structures, and each of the isolation layers extends along the first direction; a first dielectric layer, wherein the first dielectric layer covers a surface of a part of the active layers and is located between parts of adjacent ones of the active structures in a same layer and between parts of adjacent ones of the active groups; and word lines, wherein each of the word lines is located between parts of the adjacent ones of the active layers in the active group, and each of the word lines crosses a plurality of active structures located in a same layer.

BRIEF DESCRIPTIONS OF THE DRAWINGS

The accompanying drawings incorporated into the specification and constituting part of the specification illustrate the embodiments of the present disclosure, and serve, together with the specification, to explain the principles of the present disclosure. Apparently, the accompanying drawings in the following description show merely some embodiments of the present disclosure, and those of ordinary skill in the art may still derive other accompanying drawings from these drawings without creative efforts.

FIG. 1 to FIG. 24 are schematic structural diagrams corresponding to a method of manufacturing a semiconductor structure according to an embodiment of the present disclosure.

DETAILED DESCRIPTION

As can be learned from the background, the performance of the 3D stacked DRAM is to be improved. It is found through analysis that the main reason is that the 3D stacked DRAM includes a plurality of layers of word lines, and a distance between adjacent upper and lower layers of word lines is relatively small, which is easy to cause interconnection between the word lines. In addition, in a manufacturing process, an isolation structure between word lines is usually formed after formation of the word lines. Therefore, during the formation of the word lines, there is no isolation structure to isolate the upper and lower layers of word lines. This easily causes interconnection between the word lines, and thus degrades performance of a semiconductor structure.

Embodiments of the present disclosure provide a method of manufacturing a semiconductor structure. The manufacturing method includes forming a plurality of active layers on a base. An active group has upper and lower active layers. There is a first distance between the active layers in the active group. There is a second distance between adjacent active groups. The first distance is greater than the second distance. In this way, during formation of a first dielectric layer located on a surface of a part of the active layers, the first dielectric layer can further fill between parts of upper and lower adjacent ones of the active groups to isolate subsequently formed word lines, thereby avoiding interconnection between the word lines. In addition, there are two active layers between upper and lower adjacent layers of the word lines, which helps increase a distance between the adjacent ones of the word lines compared with one active layer, thereby avoiding the interconnection between the word lines.

The embodiments of the present disclosure are described in detail below with reference to the accompanying drawings. However, those skilled in the art may understand that in each embodiment of the present disclosure, many technical details are proposed to help readers better understand the embodiments of the present disclosure. However, even without these technical details and various changes and modifications made based on the following embodiments, the technical solutions claimed in the embodiments of the present disclosure can still be implemented.

As shown in FIG. 1 to FIG. 24, an embodiment of the present disclosure provides a method of manufacturing a semiconductor structure. For ease of description and clear illustration of the method of manufacturing a semiconductor structure, FIG. 1 to FIG. 24 are all partial schematic structural diagrams of the semiconductor structure. The manufacturing method is specifically described below with reference to the drawings.

Figure 2:
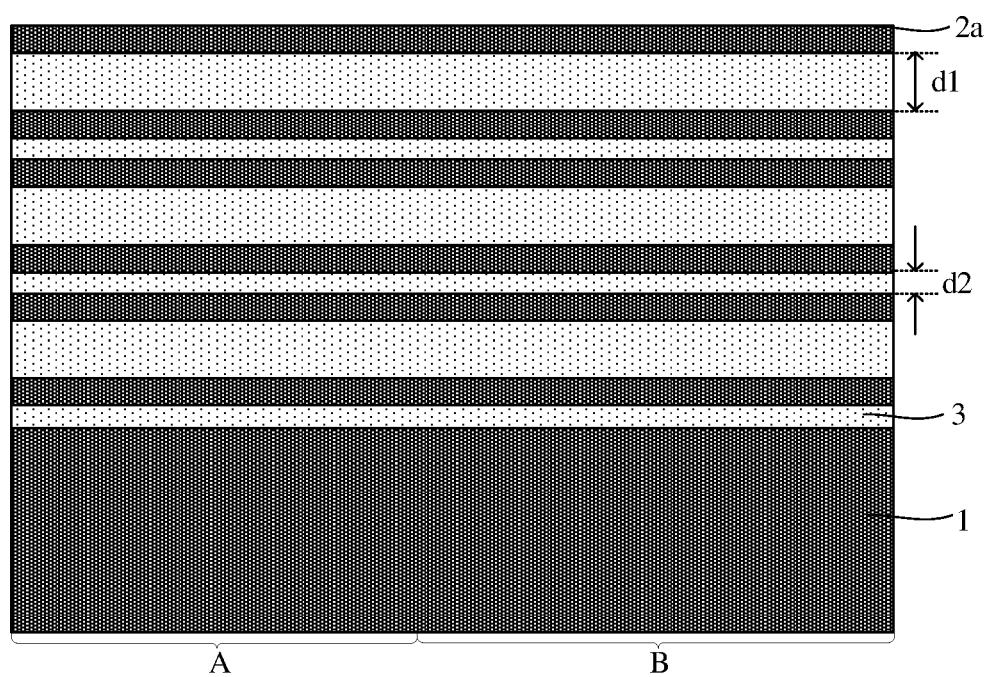

FIG. 1 is a top view, and FIG. 2 is a cross-sectional view of FIG. 1 along a direction C-C1. Referring to FIG. 1 and FIG. 2, a base 1 is provided. For example, the base 1 may be a silicon base or a germanium base. The base 1 is a structure that functions as a carrier in the semiconductor structure. Therefore, a part of the base 1 is located in a bit line region A1, a word line region A2, and a capacitor region A3 of the semiconductor structure at the same time. The bit line region A1, the word line region A2, and the capacitor region A3 are arranged in sequence in a first direction X, and jointly constitute a device region A.

In some embodiments, the semiconductor structure further includes an initial step region B, the initial step region B is located in a second direction Y of the bit line region A1, the word line region A2, and the capacitor region A3. The second direction Y is perpendicular to the first direction X. In other words, the initial step region B is provided opposite to the bit line region A1, the word line region A2, and the capacitor region A3, that is, the initial step region B and the device region A are arranged in the second direction Y. In addition, it should be noted that, both the first direction X and the second direction Y are parallel to a surface of the base 1, and both may be understood as different directions in a horizontal plane.

A plurality of active layers 2a and a plurality of sacrificial layers 3 are formed on a part of the base 1 in the bit line region A1, the word line region A2, and the capacitor region A3. The active layers 2a and the sacrificial layers 3 are alternately stacked. That is, the active layers 2a and the sacrificial layers 3 are alternately stacked on the base 1.

Two adjacent ones of the active layers 2a constitute an active group. There is a first distance d1 between the active layers 2a in the active group. There is a second distance d2 between adjacent ones of the active groups. The first distance d1 is greater than the second distance d2. In other words, a thickness of the sacrificial layer 3 between the two active layers 2a in the same active group is greater than a thickness of the sacrificial layer 3 between the adjacent ones of the active groups.

In some embodiments, a ratio of the first distance d1 to the second distance d2 is 1.8 to 3.5. It should be noted that, if the second distance d2 is relatively small, a thickness of a subsequently formed first dielectric layer 31 may be reduced, which may thus reduce an isolation effect of the first dielectric layer 31; or if the second distance d2 is relatively large, it is unfavorable for a first dielectric layer 31 to subsequently fill between parts of the adjacent ones of the active groups. When the ratio of the first distance d1 to the second distance d2 remains within the foregoing range, it helps ensure that the first distance d1 and the second distance d2 each have proper magnitude, thereby resolving the foregoing two aspects of problems.

For example, the first distance d1 is 15 nm to 30 nm, for example, 17 nm, 20 nm, or 26 nm; and the second distance d2 is 8 nm to 14 nm, for example, 11 nm, 12 nm, or 13 nm. When the first distance d1 and the second distance d2 fall within the foregoing ranges, it helps ensure that a part of the first dielectric layer 31 located between parts of the adjacent ones of the active groups has a proper thickness, thereby improving an isolation effect of upper and lower adjacent layers of word lines 51. In addition, it further helps ensure that a part of the first dielectric layer 31 fills parts of the adjacent ones of the active groups. Moreover, it further helps ensure that a subsequently formed word line 51 has a proper thickness, thereby reducing a resistance of the word line 51.

In some embodiments, the active layers 2a and the sacrificial layers 3 are further located in the initial step region B (including a subsequently formed step region B1). A positional relationship between a part of the active layers 2a and a part of the sacrificial layers 3 located in the initial step region B is the same as a positional relationship between the two in each of the bit line region A1, the word line region A2, and the capacitor region A3.

In some embodiments, a material of the sacrificial layer 3 may be silicon-germanium. A material of the active layer 2a may be the same as that of the base 1. The material of the active layer 2a may further include different doped ions.

Figure 3:
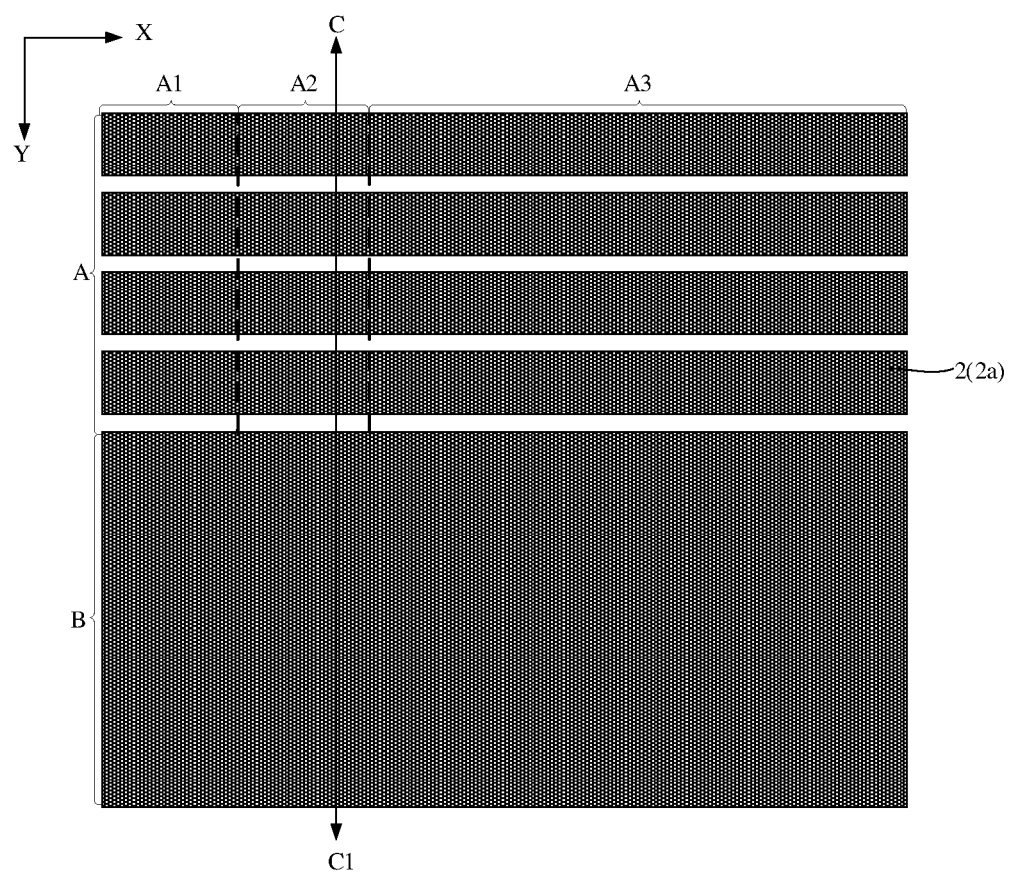
Figure 4:
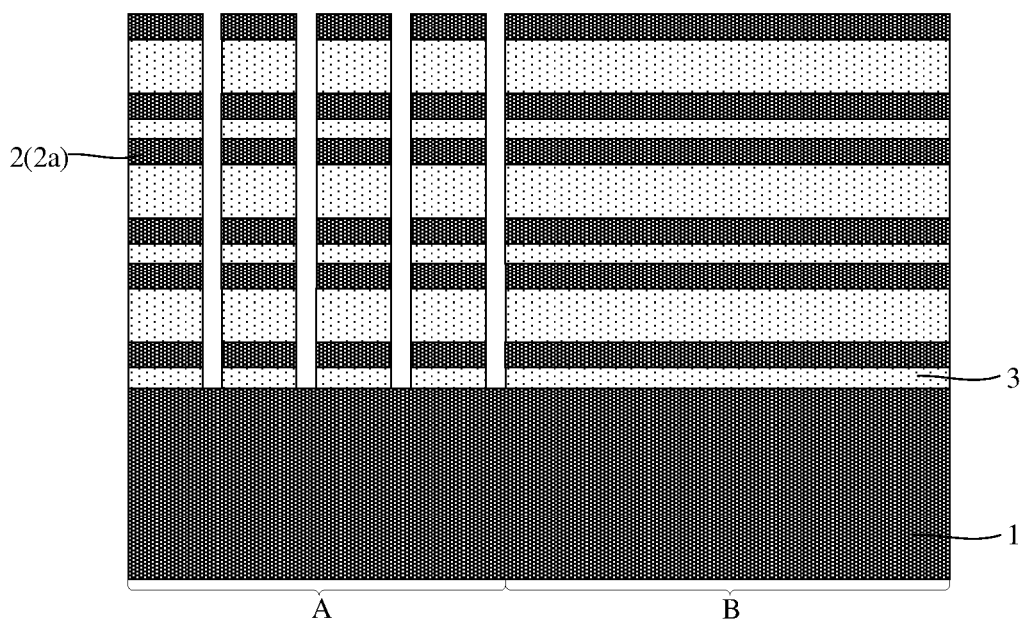

FIG. 3 is a top view, and FIG. 4 is a cross-sectional view of FIG. 3 along the direction C-C1. For ease of understanding, FIG. 3 shows only the active structures 2 and does not show the base 1. Referring to FIG. 3 and FIG. 4, a plurality of spaced isolation trenches are formed, and each of the isolation trenches penetrates through all the active layers 2a and all the sacrificial layers 3. The isolation trench extends in the first direction X and is located in the bit line region A1, the word line region A2, and the capacitor region A3. For example, part of the active layers 2a and part of the sacrificial layers 3 are removed by using an etching process to form the isolation trenches. The isolation trenches divide each of the active layers 2a to form discrete active structures 2.

Figure 5:
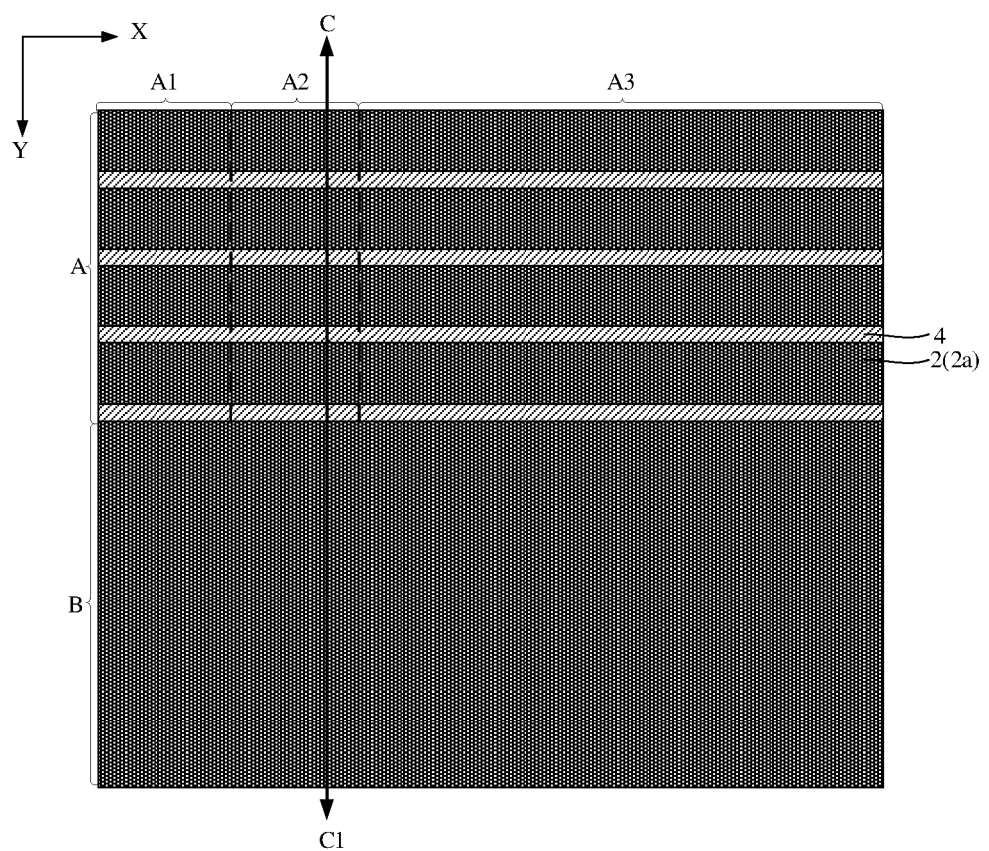
Figure 6:
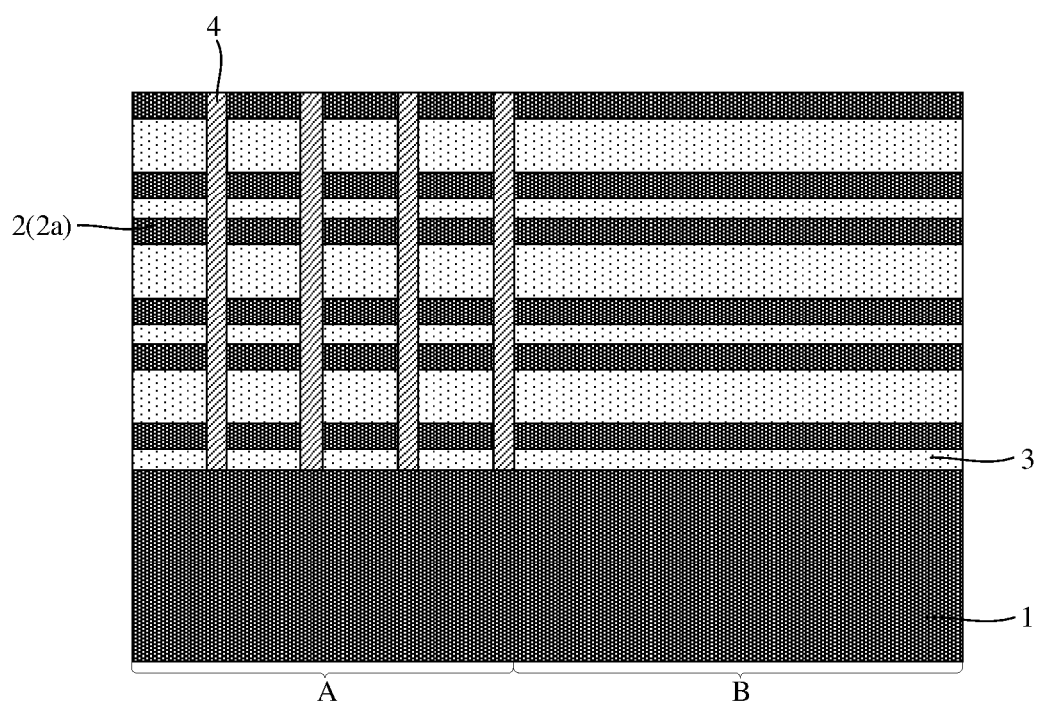

FIG. 5 is a top view, and FIG. 6 is a cross-sectional view of FIG. 5 along the direction C-C1. Referring to FIG. 5 and FIG. 6, an isolation material is deposited in the isolation trench to form an isolation layer 4. For example, silicon oxide is deposited in the isolation trench as the isolation layer 4 through a chemical vapor deposition process.

In some embodiments, a ratio of the second distance d2 to a width of the isolation layer 4 is 0.8 to 1.2. The width of the isolation layer 4 is a size of the isolation layer 4 in the second direction Y. It should be noted that, both the isolation layer 4 and a part of the first dielectric layer located between parts of adjacent active groups are used to isolate subsequently formed transistors. The part of the first dielectric layer is used to isolate transistors in a vertical direction. The isolation layer 4 is used to isolate transistors in a horizontal direction. When the ratio of the second distance d2 to the width of the isolation layer 4 remains in the foregoing range, it helps the part of the first dielectric layer fill between parts of the adjacent active groups, and further helps ensure that the isolation layer 4 and the part of the first dielectric layer have a favorable isolation effect.

In this way, based on FIG. 3 to FIG. 6, a plurality of isolation layers 4 may be formed. Each of the isolation layers 4 penetrates through all the active layers 2a and all the sacrificial layers 3, and the isolation layers 4 divide each of the active layers 2a into a plurality of active structures 2. The isolation layer 4 extends along the first direction X. In other words, a plurality of active structures 2 in a same layer are arranged in the second direction Y.

The active structure 2 includes a first source-drain region, a channel region, and a second source-drain region arranged in sequence in the first direction X. The first source-drain region is located in the bit line region A1. The channel region is located in the word line region A2. The second source-drain region is located in the capacitor region A3. The first source-drain region and the second source-drain region may have a same type of doped ions. The channel region may have an opposite type of doped ions to the doped ions of the first source-drain region and the second source-drain region. For example, the first source-drain region and the second source-drain region have N-type doped ions, and the channel region has P-type doped ions.

Figure 7:
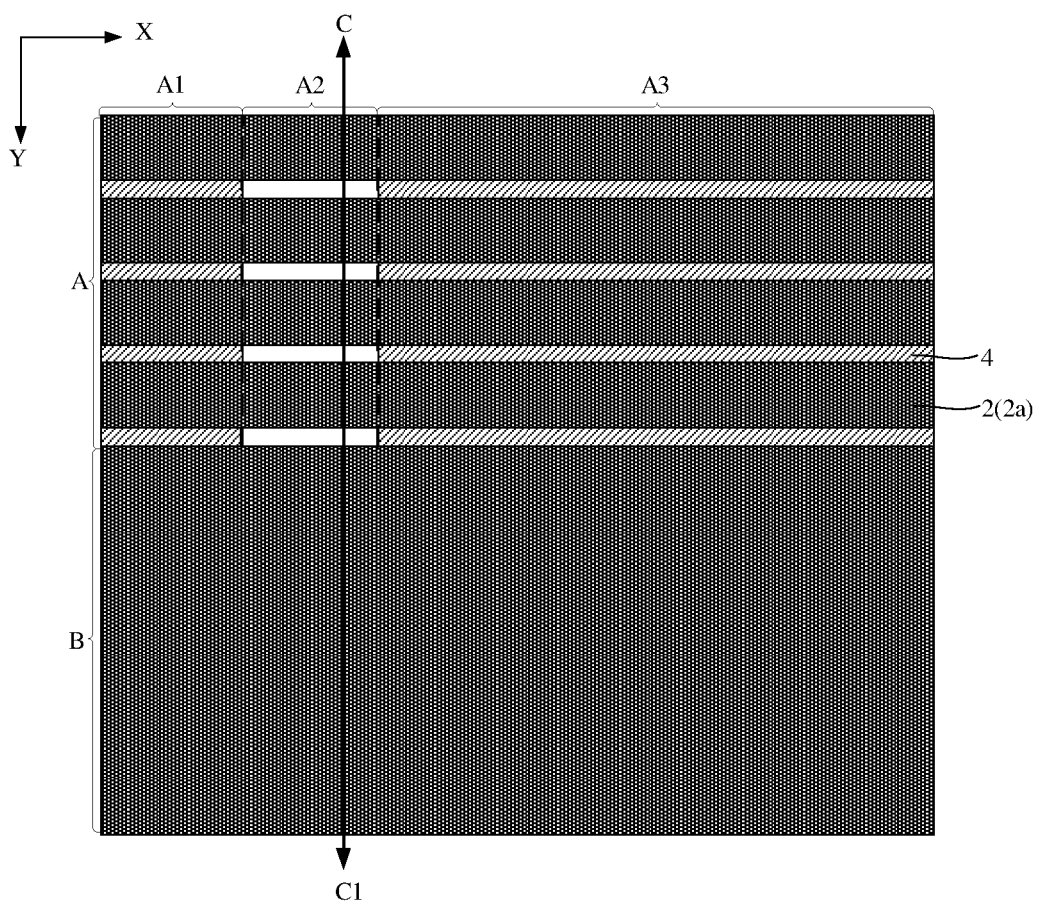
Figure 8:
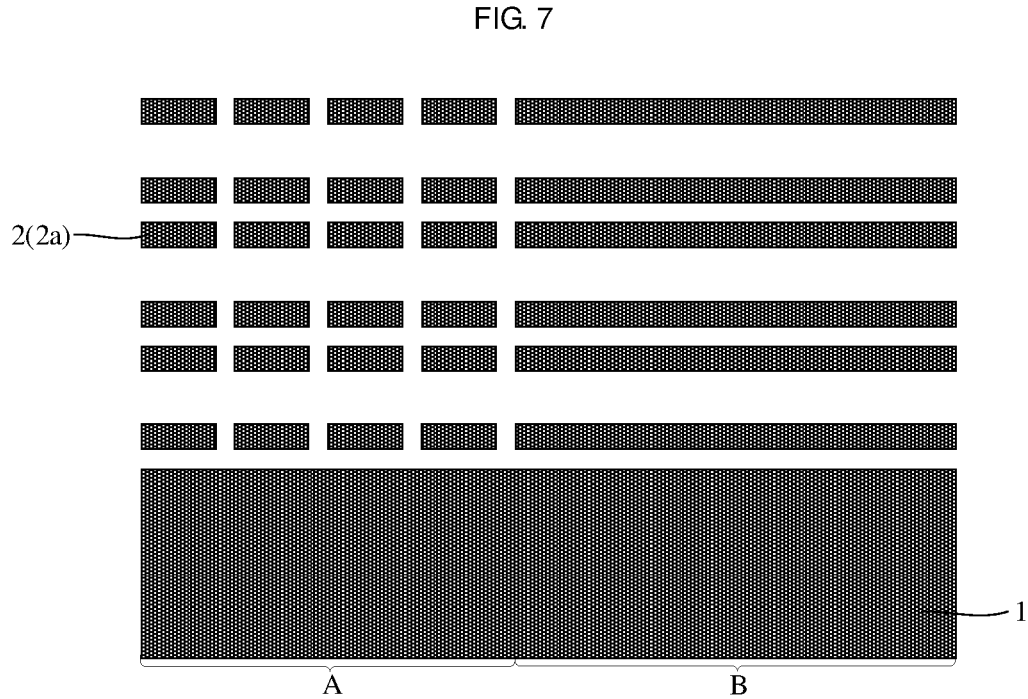

FIG. 7 is a top view, and FIG. 8 is a cross-sectional view of FIG. 7 along the direction C-C1. Referring to FIG. 7 and FIG. 8, a part of the isolation layers 4 located in the word line region A2 and a part of the sacrificial layers 3 located in the word line region A2 are removed. In some embodiments, during the removal of the part of the isolation layers 4 located in the word line region A2, part of the sacrificial layers 3 located in the initial step region B may be further removed, that is, a part of the sacrificial layers 3 located in the subsequently formed step region B1 is removed.

For example, a mask layer that covers the capacitor region A3, the bit line region A1, and part of the initial step region B is formed. The mask layer exposes the word line region A2 and part of the initial step region B (that is, the subsequently formed step region B1). The part of the isolation layers 4 and the part of the sacrificial layers 3 in the word line region A2 and the part of the sacrificial layers 3 in part of the initial step region B are wet etched to expose a part of each layer of the active structures 2.

Figure 9:
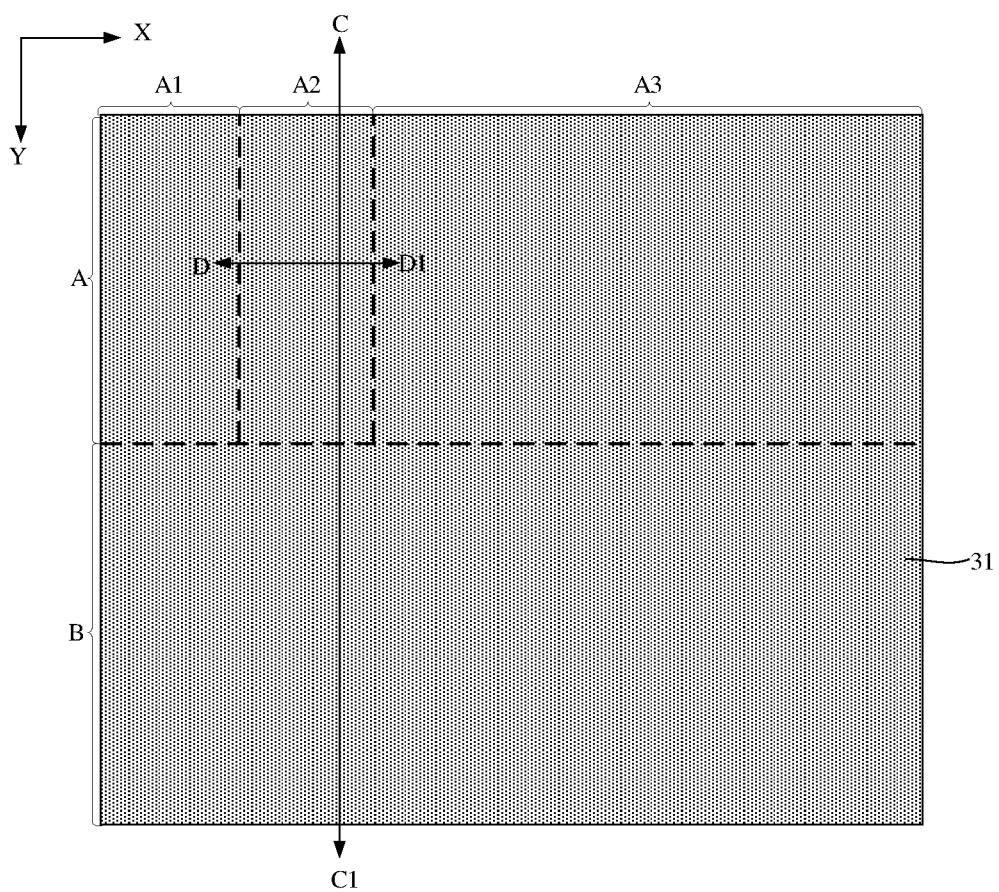
Figure 10:
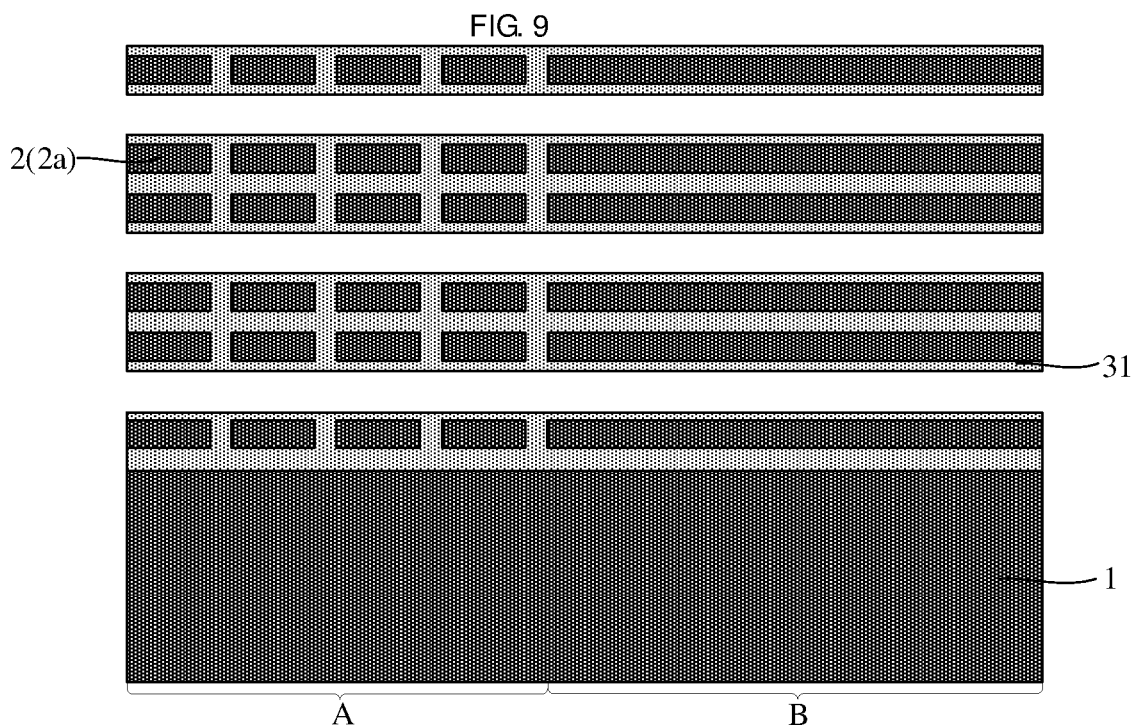
Figure 11:
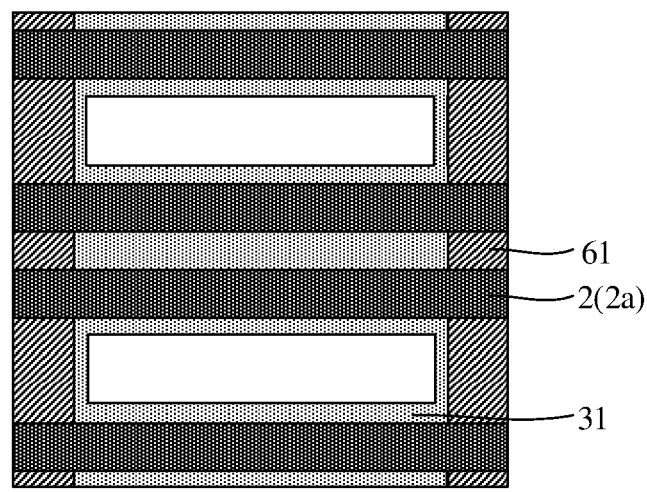

FIG. 9 is a top view, FIG. 10 is a cross-sectional view of FIG. 9 in the direction C-C1, and FIG. 11 is a partial cross-sectional view of FIG. 9 in a direction D-D1. Referring to FIG. 9 and FIG. 10, a first dielectric layer 31 is formed in the word line region A2. The first dielectric layer 31 covers a surface of a part of the active layers 2a and is located between parts of adjacent ones of the active structures 2 in a same layer and between parts of adjacent ones of the active groups.

Specifically, a part of the first dielectric layer 31 located on the surface of a part of the active structure 2 may be used to constitute a gate dielectric layer of a transistor. The part of the first dielectric layer 31 located between the parts of adjacent ones of the active structures 2 in the same layer may connect parts of the active structures 2 in the same layer in the word line region A2 to ensure that an elongated word line 51 can be formed. The part of the first dielectric layer 31 located between parts of the adjacent ones of the active groups may be used as an isolation structure for subsequently formed adjacent transistors in the vertical direction.

Because the first distance d1 is greater than the second distance d2, when a space between parts of the adjacent ones of the active groups is filled with a part of the first dielectric layer 31, a space in the active group is not filled, such that a spatial position can be reserved for the subsequently formed word line 51. In other words, a thickness difference of the sacrificial layers 3 is set, such that first dielectric layers 31 with a plurality of functions can be formed in a same step, thereby helping simplify a production process.

In some embodiments, the first dielectric layer 31 is further located in the initial step region B (including the subsequently formed step region B1), and a positional relationship between a part of the first dielectric layer 31 and a part of the active structures 2 that are located in the initial step region B is the same as a positional relationship between the two in the word line region A2.

For example, the first dielectric layer 31 may be formed through an atomic layer deposition process and in-situ steam generation (ISSG).

Still referring to FIG. 11, before the formation of the first dielectric layer 31, the following may be further included: forming an insulating layer 61 on a sidewall of the word line region A2 close to the capacitor region A3. In addition, the insulating layer 61 may be further located on a sidewall of the word line region A2 close to the bit line region A1. That is, the insulating layer 61 is located on two opposite sides of the word line region A2. The insulating layer 61 can isolate the word line 51 from a subsequently formed capacitor 70 and bit line conductive layer 81, and can be used to support the active structures 2 in the vertical direction, thereby improving robustness of the semiconductor structure and avoiding a problem of collapse.

Figure 12:
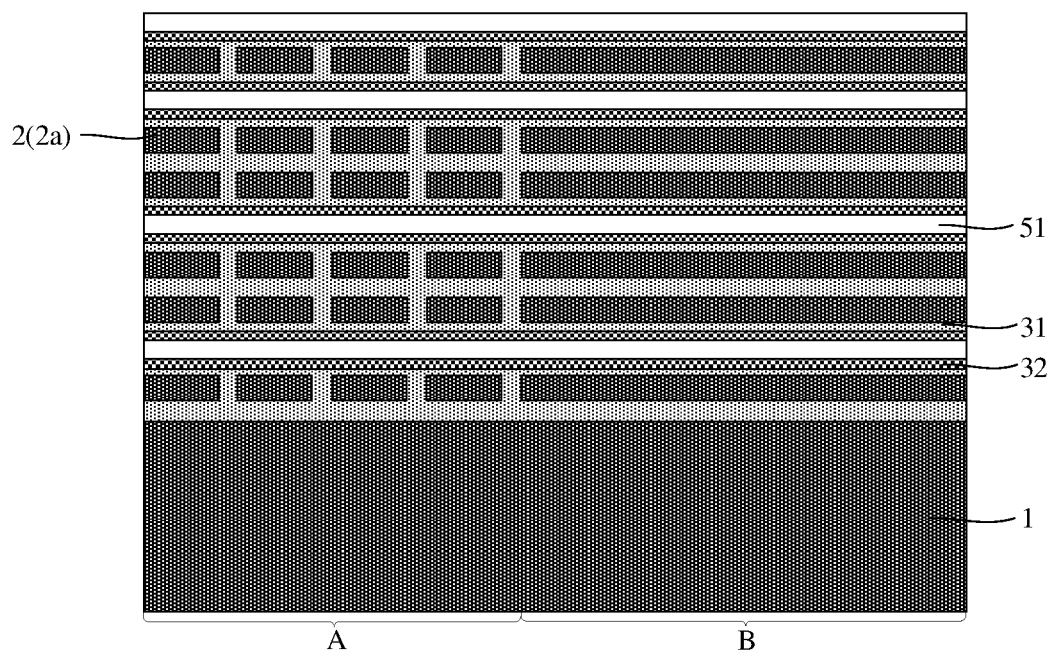

FIG. 12 is a cross-sectional view of the semiconductor structure in the direction C-C1. Referring to FIG. 12, a second dielectric layer 32 is formed, and the second dielectric layer 32 covers a surface of the first dielectric layer 31 and is located between the first dielectric layer 31 and the word lines 51. A dielectric constant of the second dielectric layer 32 is greater than a dielectric constant of the first dielectric layer 31. That is, the part of the first dielectric layer 31 and the part of the second dielectric layer 32 located between parts of the active groups are jointly used as a gate dielectric layer. The second dielectric layer 32 helps improve a breakdown field strength and reduce an electric leakage. In some other embodiments, alternatively, the second dielectric layer 32 may not be formed.

For example, the first dielectric layer 31 may be made of silicon oxide, the second dielectric layer 32 may be made of a high dielectric constant material, such as zirconium oxide, hafnium oxide, aluminum oxide, or niobium oxide.

In some embodiments, the second dielectric layer 32 is further located in the initial step region B (including the subsequently formed step region B1), and a positional relationship between a part of the second dielectric layer 32 and a part of the first dielectric layer 31 that are located in the initial step region B is the same as a positional relationship between the two in the word line region A2.

Still referring to FIG. 12, after the formation of the second dielectric layer 32, a plurality of word lines 51 are formed in the word line region A2. Each word line 51 is located between parts of the active layers 2a in the active group, and each of the word lines 51 crosses a plurality of active structures 2 located in the same layer. In other words, the plurality of word lines 51 are arranged in the vertical direction and extend along the second direction Y. Two active structures 2 in the group of the active layers 2a, a part of the first dielectric layer 31, a part of the second dielectric layer 32, and the word line 51 form a transistor. The transistor has two upper and lower channels.

It should be noted that, before the formation of the word lines 51, the part of the first dielectric layer 31 used for isolation has been formed between the upper and lower parts of adjacent active groups. Therefore, after the formation of the word lines 51, transistors consisting of the upper and lower adjacent active groups are isolated from each other. Under the isolation effect of the part of the first dielectric layer 31, interconnection between adjacent ones of the word lines 51 can be avoided.

In some embodiments, the word lines 51 are further located in the initial step region B (including the subsequently formed step region B1), and a part of the word lines 51 located in the initial step region B is used to draw out a part of the word lines 51 located in the word line region A2 to facilitate subsequent formation of connecting pillars 52.

For example, a metallic material such as tungsten, titanium, cobalt, or molybdenum is deposited as the word lines 51.

Figure 13:
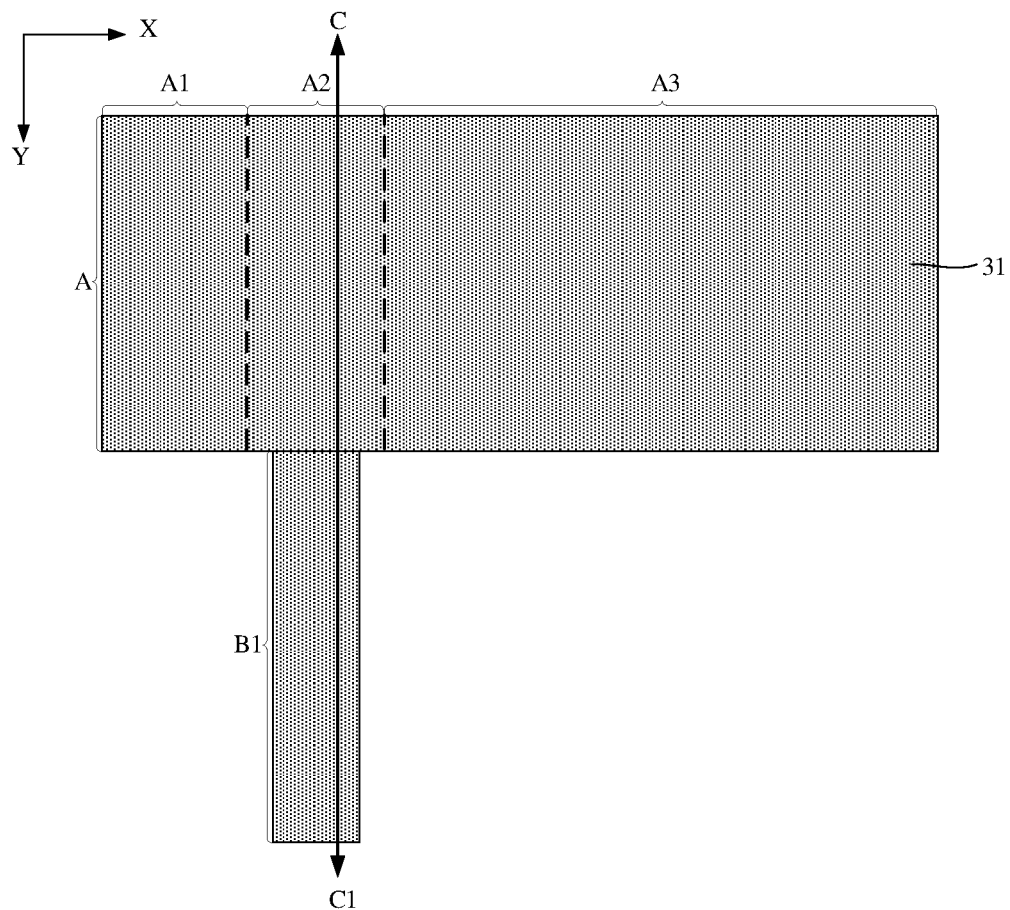

Referring to FIG. 13, the initial step region B is patterned to form the step region B1. The step region B1 is located in the second direction Y of the word line region A2 and is connected to the word line region A2, that is, the step region B1 and the word line region A2 are arranged in the second direction Y. That is, the initial step region B other than the step region B1 is removed by using an etching process.

Figure 14:
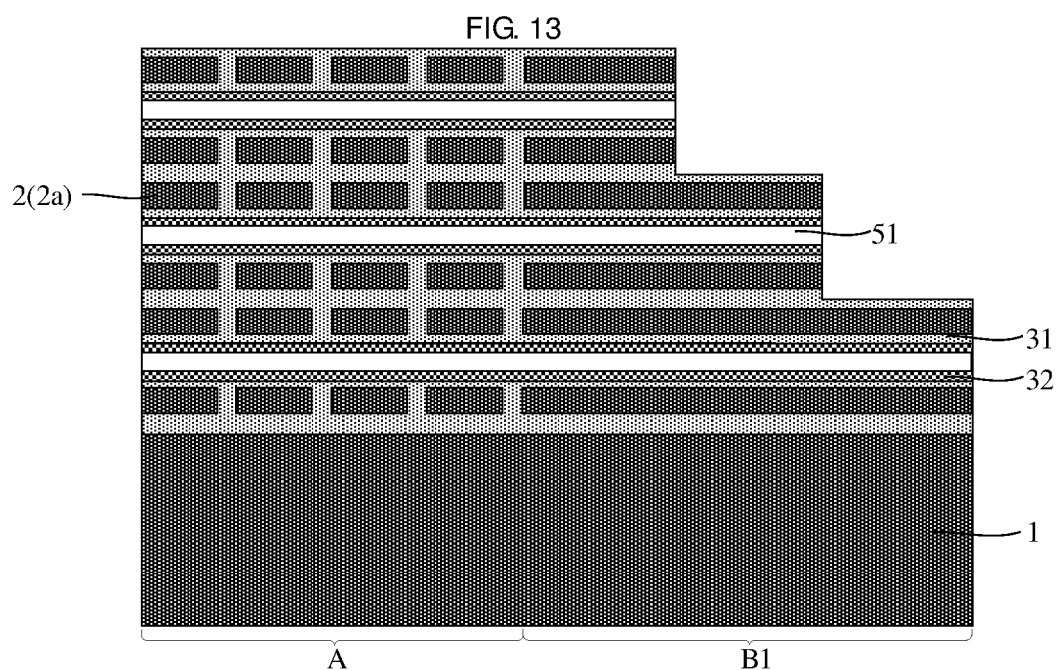

FIG. 13 is a top view, and FIG. 14 is a cross-sectional view of FIG. 13 in the direction C-C1. Referring to FIG. 13 and FIG. 14, the step region B1 is patterned to form a plurality of steps. The part of the active layers 2a in the same active group, a part of the first dielectric layer 31, and a part of the word line 51 are used to form the corresponding step. In other words, a part of two active layers 2a in the same active group are used as a boundary, the part of the two active layers 2a and a part of the first dielectric layer 31, a part of the second dielectric layer 32, and a part of the word line 51 therebetween are used to form the corresponding step. In a direction that the word line region A2 points to the step region B1, heights of the plurality of steps are sequentially reduced.

Figure 15:
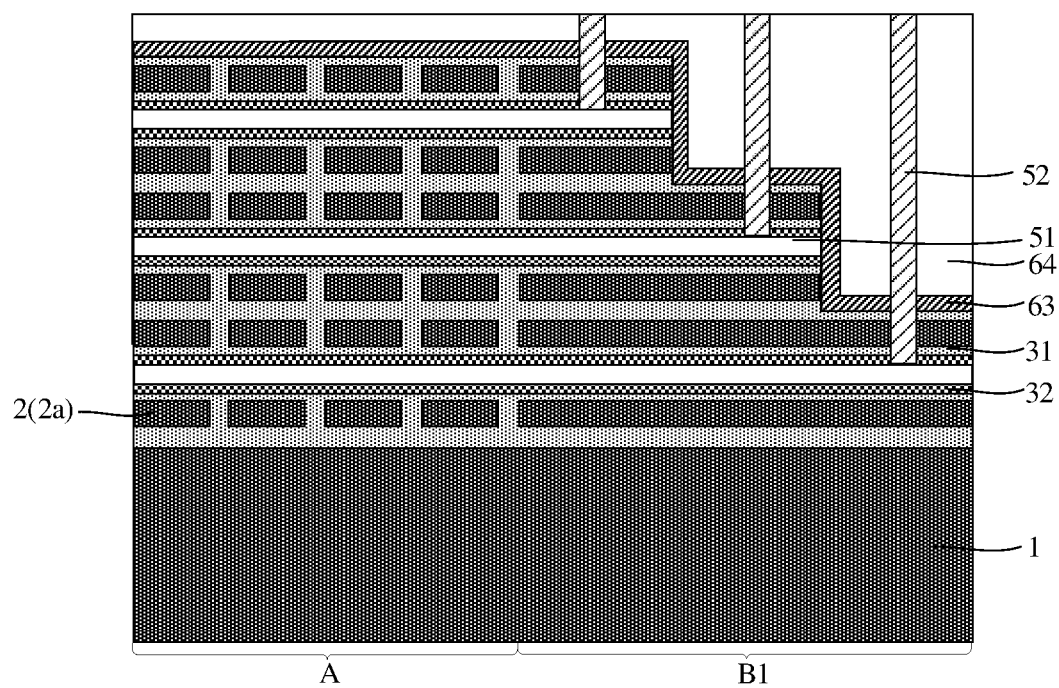

Referring to FIG. 15, a plurality of connecting pillars 52 are formed. The connecting pillars 52 are in a one-to-one correspondence with the steps and are connected to the word lines 51 in a one-to-one correspondence. The connecting pillar 52 can draw out the word line 51 in each layer for connection to a peripheral circuit.

In some embodiments, the forming a plurality of connecting pillars 52 includes: forming a filling dielectric layer 64, wherein the filling dielectric layer 64 covers the steps in the step region B1. For example, the filling dielectric layer 64 has different thicknesses on different steps. A part of the filling dielectric layer 64 corresponding to a step with a relatively large height has a relatively small thickness; a part of the filling dielectric layer 64 corresponding to a step with a relatively small height has a relatively large thickness, such that a surface of the semiconductor structure is relatively flat. For example, a material of the filling dielectric layer 64 may be silicon oxide.

A plurality of through holes are formed in the filling dielectric layer 64. The plurality of through holes are in a one-to-one correspondence with the steps. The through hole further penetrates through a part of the active structure 2 and a part of the first dielectric layer 31 that are located in an upper part and that correspond to the step and exposes a part of an upper surface of a part of the word line 51. For example, each step is etched until the part of the word line 51 corresponding to each step is exposed.

The connecting pillar 52 that fills the through hole is formed. For example, a metallic material such as aluminum, copper, tungsten, or titanium is deposited in the through hole as the connecting pillar 52.

In some embodiments, after the formation of the steps and before the formation of the filling dielectric layer 64, the following is further included: forming a protective layer 63 that covers a surface of the steps, wherein the through hole further penetrates through the protective layer 63. During the formation of the through hole, the protective layer 63 can protect the surface of the step and also help improve pattern precision of the through hole. A material of the protective layer 63 is different from those of the first dielectric layer 31 and the filling dielectric layer 64. For example, silicon nitride is deposited on the surface of the steps as the protective layer 63. In addition to the surface of the steps, the protective layer 63 further may cover a surface of another region of the semiconductor structure.

Figure 16:
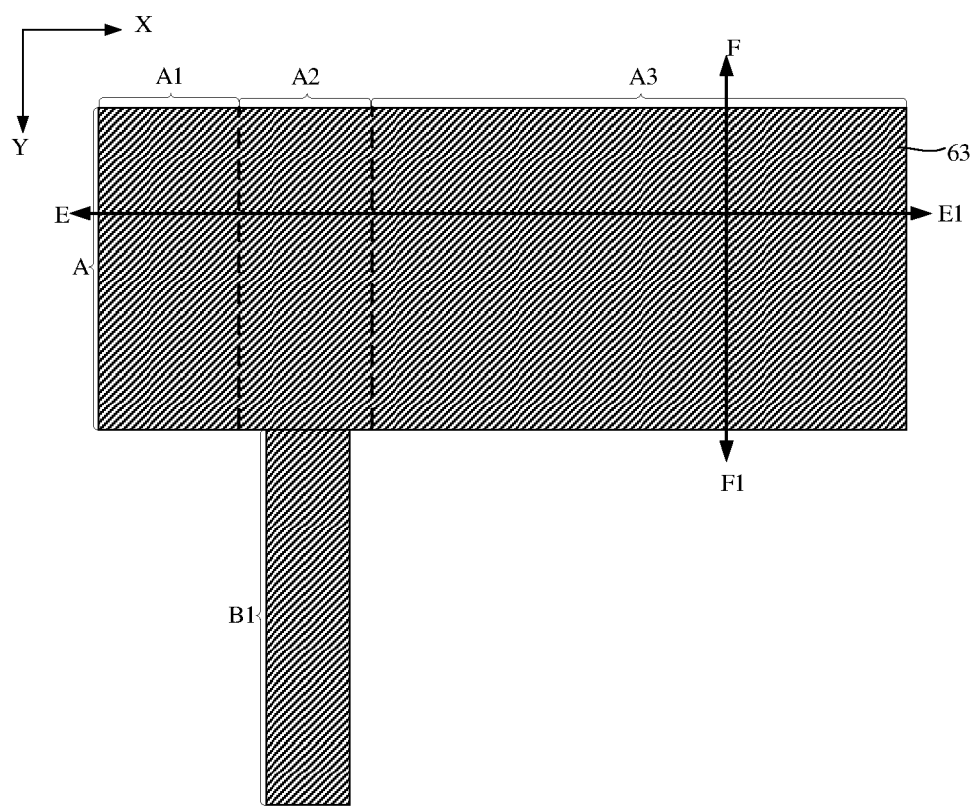
Figure 17:
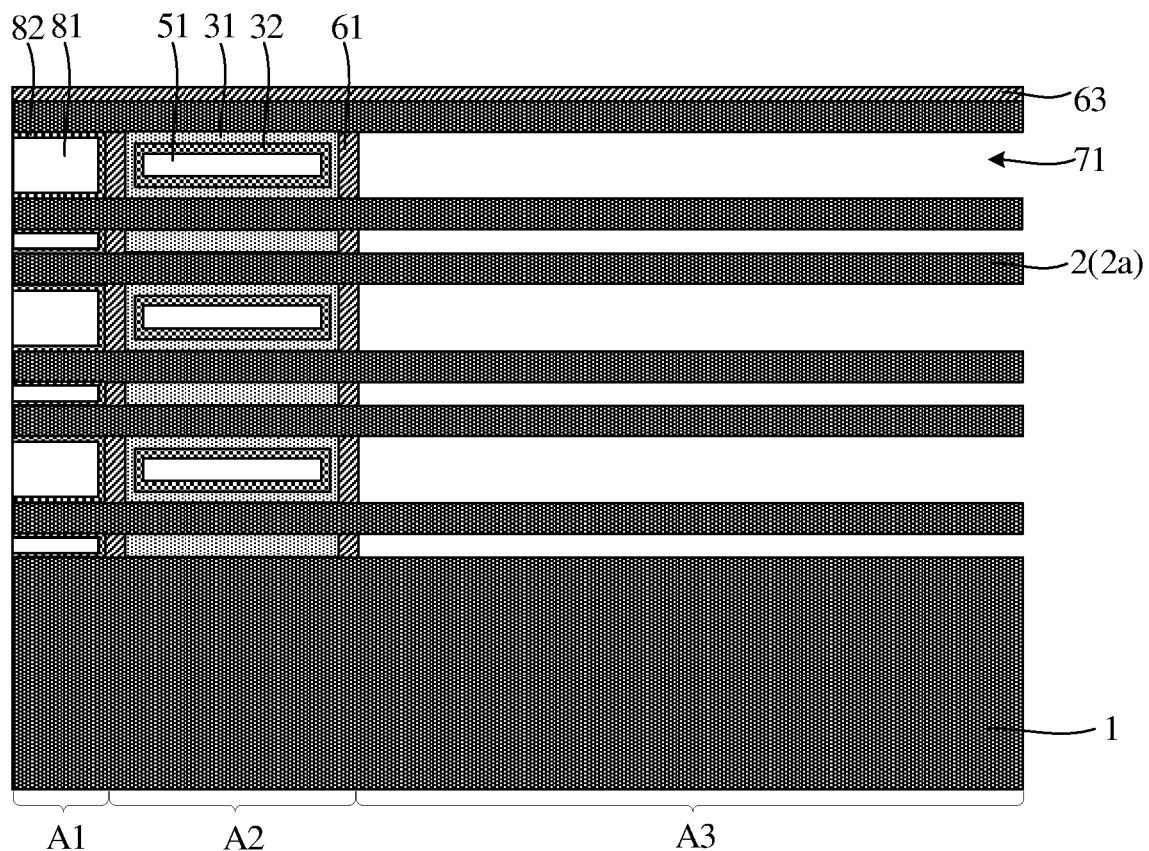
Figure 18:
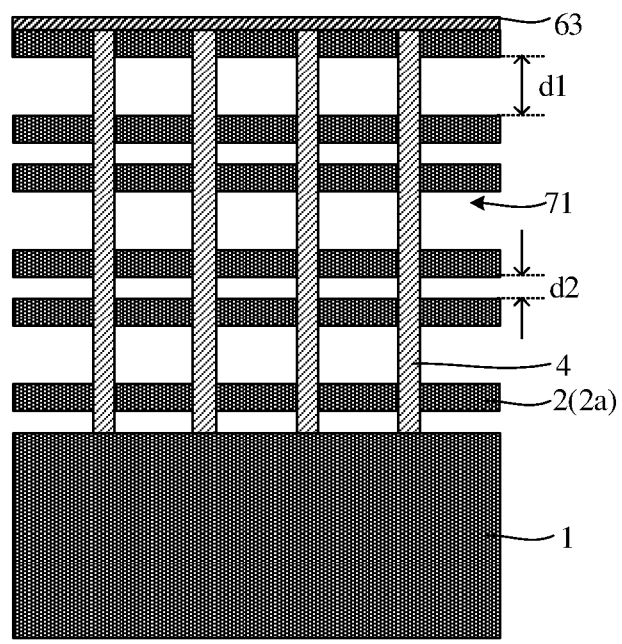

FIG. 16 is a top view, FIG. 17 is a cross-sectional view of FIG. 16 in a direction E-E1, and FIG. 18 is a cross-sectional view of FIG. 16 in a direction F-F1. Referring to FIG. 16 to FIG. 18, a part of the sacrificial layers 3 located in the capacitor region A3 is removed to expose the insulating layer 61. A part of the active structures 2 in a same active group, a part of the isolation layers 4, and a part of the insulating layer 61 enclose a capacitor hole 71. In other words, in a direction perpendicular to the surface of the base 1, a height of the capacitor hole 71 is the first distance d1. In the second direction Y, a width of the capacitor hole 71 is a distance between two adjacent isolation layers 4. For example, the part of the sacrificial layers 3 in the capacitor region A3 may be removed by using a wet etching process.

Figure 19:
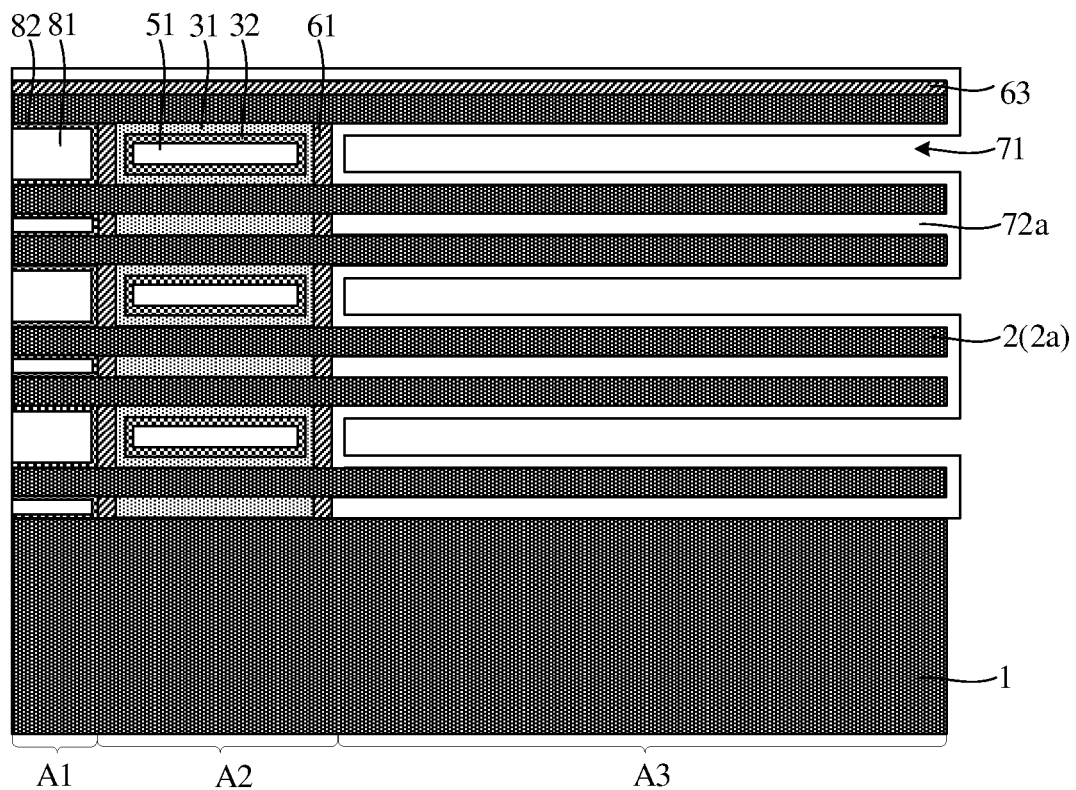
Figure 20:
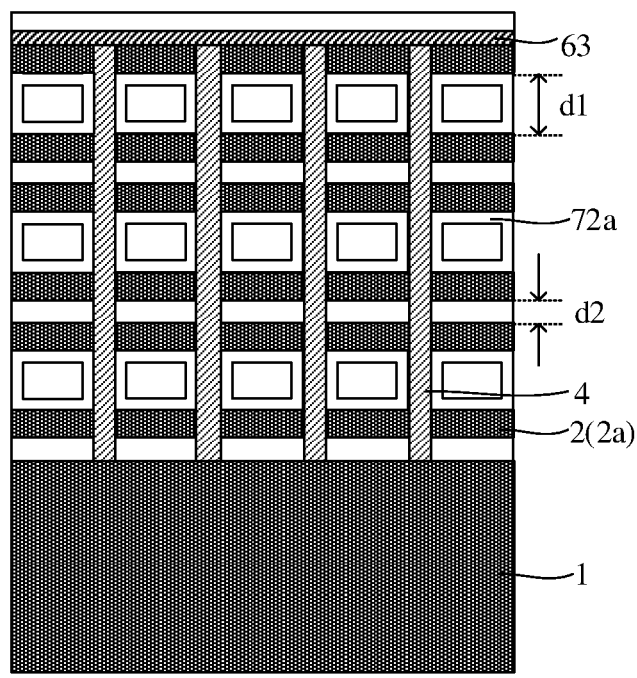

FIG. 19 is a cross-sectional view of the semiconductor structure in the direction E-E1, and FIG. 20 is a cross-sectional view of the semiconductor structure in the direction F-F1. Referring to FIG. 19 and FIG. 20, an initial bottom electrode 72a is formed in the capacitor region A3. The initial bottom electrode 72a is located on a surface of a part of the active structures 2, a surface of a part of the insulating layer 61, and a surface of a part of the isolation layers 4 and fills between the parts of the adjacent ones of the active groups.

Because the first distance d1 is greater than the second distance d2, when a space between parts of the adjacent ones of the active groups is filled with the initial bottom electrode 72a, a space in the active group is not filled, such that spatial positions can be reserved for a subsequently formed capacitor dielectric layer 73 and top electrode 74. In other words, a thickness difference of the sacrificial layers 3 is set, such that a filling layer 722 can be formed during formation of a bottom electrode 721, thereby helping simplify a production process.

For example, a metal such as titanium nitride, titanium, cobalt, tungsten, copper, or ruthenium is deposited as the initial bottom electrode 72a.

Figure 21:
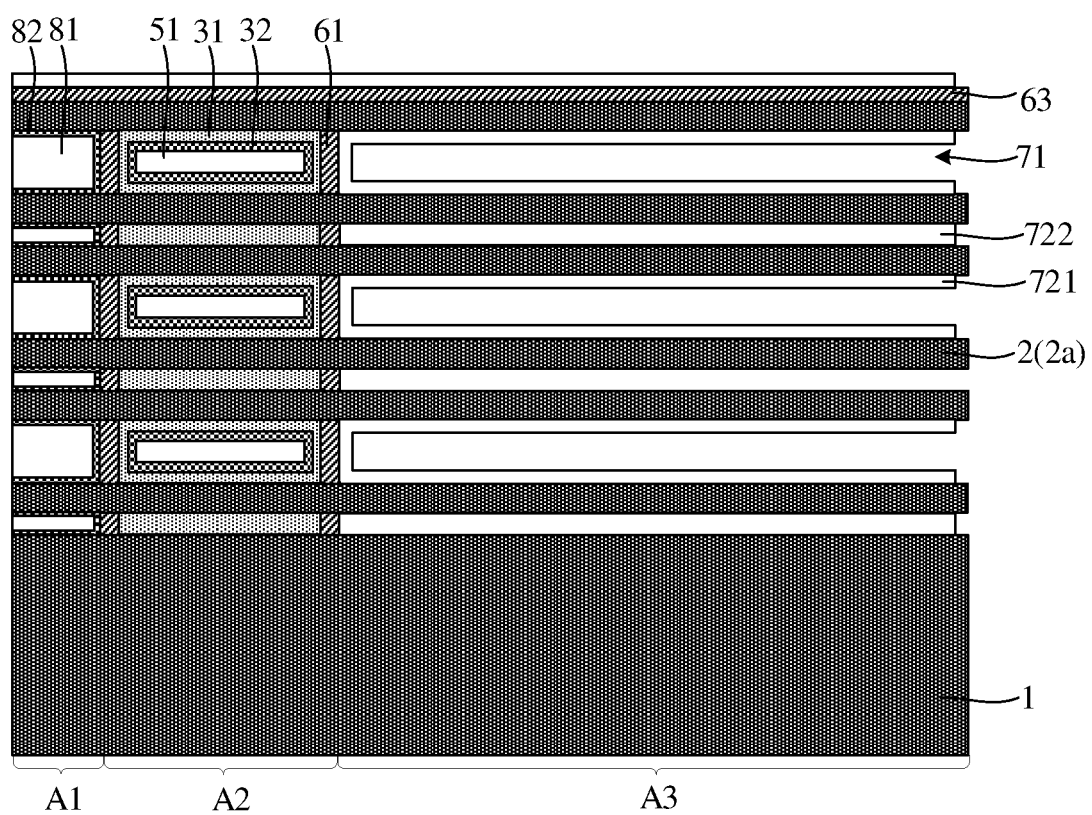

FIG. 21 is a cross-sectional view of the semiconductor structure in the direction E-E1. Referring to FIG. 21, as a part of the active structures 2 located in the capacitor region A3 has an end face away from the word line region A2, a part of the initial bottom electrode 72a located on the end face is removed. The part of the initial bottom electrode 72a that fills between the parts of the adjacent ones of the active groups is used as the filling layer 722. The part of the initial bottom electrode 72a located in the capacitor hole 71 is used as the bottom electrode 721.

That is, the initial bottom electrode 72a is truncated to enable parts of the initial bottom electrode 72a located in different the capacitor holes 71 to be disconnected from each other, thereby achieving mutual isolation of capacitors 70.

In some embodiments, the removing the part of the initial bottom electrode 72*a* located on the end face includes: filling the capacitor hole 71 with a capacitor-protection layer, wherein the capacitor-protection layer covers a part of the initial bottom electrode 72*a* located on an inner wall of the capacitor hole 71 and exposes the part of the initial bottom electrode 72*a* located on the end face; removing the part of the initial bottom electrode 72*a* located on the end face by using a wet etching process; and removing the capacitor-protection layer.

That is, during the removal of the part of the initial bottom electrode 72*a* on the end face, the capacitor-protection layer can protect the part of the initial bottom electrode 72*a* in the capacitor hole 71 and prevent the part of the initial bottom electrode 72*a* in the capacitor hole 71 from being consumed, thereby helping reduce a resistance of the bottom electrode 721.

In some other embodiments, alternatively, in order to simplify processes, the capacitor-protection layer may not be formed. The main reason is that during etching, the part of the initial bottom electrode 72*a* located on the end face is first removed, and due to a relatively small size of the capacitor hole 71, the part of the initial bottom electrode 72*a* located in the capacitor hole 71 can be retained, and part of the initial bottom electrode 72*a* in the capacitor hole 71 on a side close to the end face may be removed. Therefore, an etching degree of the initial bottom electrode 72*a* may be controlled by controlling an etching time.

In this way, based on FIG. 19 and FIG. 21, the bottom electrode 721 may be formed on the inner wall of the capacitor hole 71 and the filling layer 722 is formed between parts of the adjacent ones of the active groups. The filling layer 722 can support upper and lower layers of active structures 2 to avoid a problem of collapse.

Figure 22:
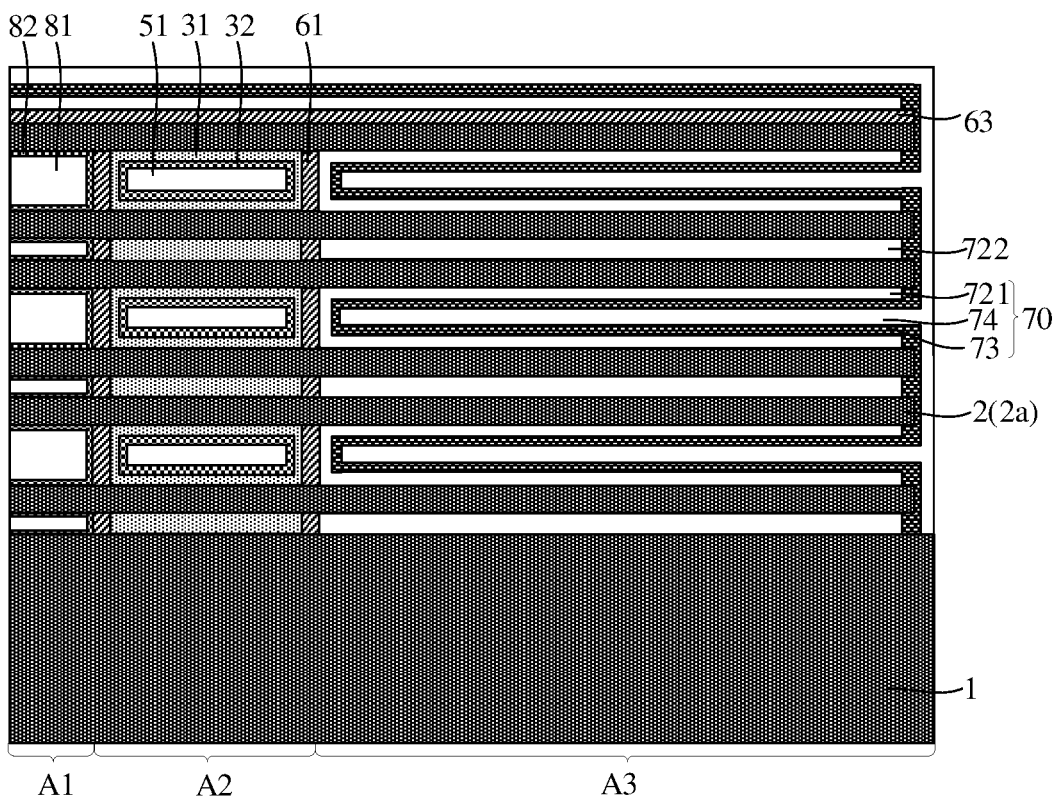
Figure 23:
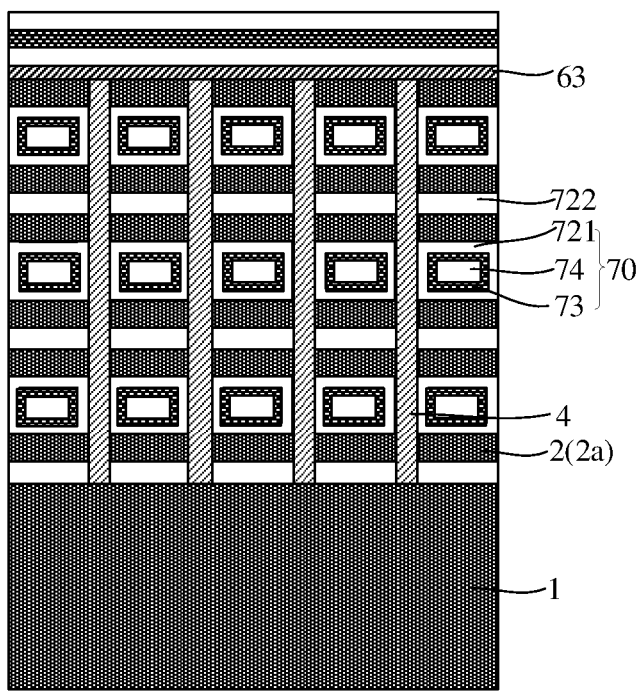

FIG. 22 is a cross-sectional view of the semiconductor structure in the direction E-E1. FIG. 23 is a cross-sectional view of the semiconductor structure along the direction F-F1. Referring to FIG. 22 and FIG. 23, a capacitor dielectric layer 73 is formed on a surface of the bottom electrode 721. Capacitor dielectric layers 73 located in different capacitor holes 71 can be connected by capacitor dielectric layers 73 located on the end face.

For example, a high dielectric constant material is deposited as the capacitor dielectric layer 73. The high dielectric constant material helps increase a capacity of the capacitor 70. The high dielectric constant material may be zirconium oxide, hafnium oxide, aluminum oxide, niobium oxide, or the like.

A top electrode 74 is formed on a surface of the capacitor dielectric layer 73, and top electrodes 74 located in different capacitor holes 71 are interconnected. For example, a metal such as titanium nitride, titanium, cobalt, tungsten, copper, or ruthenium is deposited as the top electrode 74.

The capacitor dielectric layer 73, the top electrode 74, and the bottom electrode 721 form a capacitor 70. As can be learned from FIG. 22, the capacitor 70 is electrically connected to two active structures 2 formed in a same active group. In an extension direction of the capacitor hole 71, the capacitor 70 is in contact with sidewalls of parts of the active structures 2, and a contact resistance can be reduced due to a relatively large contact area, thereby improving performance of the semiconductor structure.

As shown in FIG. 17, FIG. 19, FIG. 21, and FIG. 22, after the formation of the isolation layers 4, the following is further included: removing a part of the sacrificial layers 3 located in the bit line region A1; and forming a bit line conductive layer 81 in the bit line region A1, wherein the bit line conductive layer 81 is located between parts of the active structures 2 in a same active group and between parts of the adjacent ones of the active groups and is further located between parts of adjacent ones of the isolation layers 4. That is, in a direction perpendicular to the surface of the base 1, parts of the bit line conductive layer 81 and parts of the active structures 2 are alternately stacked for connecting parts of adjacent ones of the active structures 2. In addition, a part of the insulating layer 61 located on a sidewall of the word line region A2 close to the bit line region A1 isolates the word lines 51 from the bit line conductive layer 81. For example, a metallic material such as tungsten, titanium, cobalt, or molybdenum is deposited as the bit line conductive layer 81.

In some embodiments, before the formation of the bit line conductive layer 81, the following is further included: forming a bit line contact layer 82. For example, a metal silicide is deposited as the bit line contact layer 82 to reduce a contact resistance the bit line conductive layer 81 and parts of the active structures 2.

Figure 24:
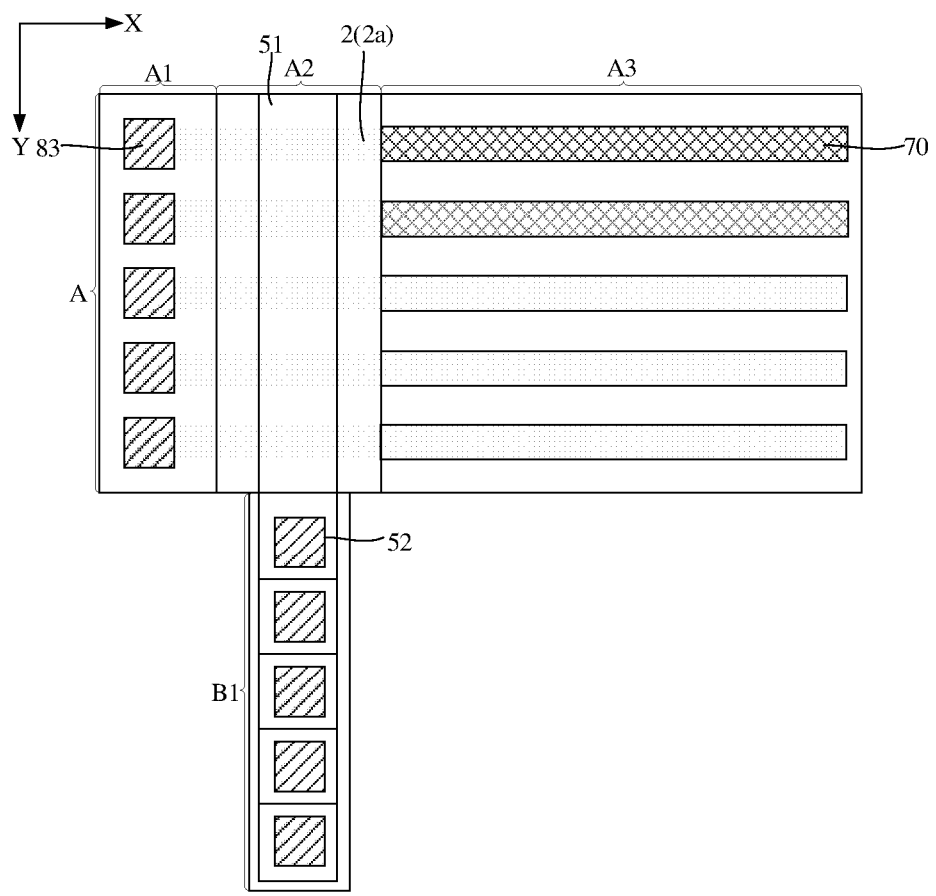

Referring to FIG. 24, FIG. 24 is a top perspective view of the semiconductor structure. For ease of understanding, FIG. 24 shows only a partial structure of the semiconductor structure. A plurality of bit lines 83 that are arranged at intervals are formed in the bit line region A1. An extension direction of each bit line 83 is perpendicular to the surface of the base 1, and the bit line 83 is connected to an end face, away from the word line region A2, of a part of the corresponding active structure 2 located in the bit line region A1. That is, one bit line 83 is electrically connected to first source-drain regions of a plurality of layers of the active structures 2. In addition, the bit line 83 is further electrically connected to the bit line conductive layer 81. In some other embodiments, alternatively, the bit line 83 may not be formed, and a part of the bit line conductive layer 81 and parts of the active structures 2 may be directly used as a bit line jointly. The parts of the active structures 2 in contact with the bit line conductive layer 81 are heavily doped.

It should be noted that, there is no restriction on an order of formation steps of the structures in the bit line region A1, the word line region A2, the capacitor region A3, and the step region B1. For example, the bit line conductive layer 81 and the bit lines 83 in the bit line region A1 may be first formed; then the word lines 51, the first dielectric layer 31, and the second dielectric layer 32 in the word line region A2 are formed; subsequently, the steps in the step region B1 are formed; and subsequently, the capacitors 70 in the capacitor region A3 are formed.

In summary, in this embodiment of the present disclosure, the word lines 51 in the vertical direction are isolated by using the thickness difference of the sacrificial layers 3. In addition, there are parts of two layers of active structures 2 between adjacent ones of the word lines 51, and a distance between the word lines 51 is larger, thereby avoiding a problem of interconnection between the word lines 51. In addition, the capacitor 70 is made by using the space in a part of the active group, thereby simplifying the process to some extent.

As shown in FIG. 12, FIG. 15, FIG. 22, FIG. 23, and FIG. 24, another embodiment of the present disclosure provides a semiconductor structure. The manufacturing method in the foregoing embodiment can be used to manufacture this semiconductor structure. For detailed description of this semiconductor structure, refer to the detailed description in the foregoing embodiment.

Specifically, referring to FIG. 12 and FIG. 24, this semiconductor structure includes a bit line region A1, a word line region A2, and a capacitor region A3 arranged in sequence in a first direction X. The semiconductor structure further includes: a base 1; a plurality of active layers 2a stacked on a part of the base 1 in the bit line region A1, the word line region A2, and the capacitor region A3, wherein two adjacent ones of the active layers 2a constitute an active group, there is a first distance d1 between the active layers 2a in the active group, there is a second distance d2 between adjacent ones of the active groups, and the first distance d1 is greater than the second distance d2; a plurality of isolation layers 4, wherein each of the isolation layers 4 penetrates through all the active layers 2a, and the isolation layers 4 divide each of the active layers 2a into a plurality of active structures 2, and each isolation layer 4 extends along the first direction X; a first dielectric layer 31, wherein the first dielectric layer 31 covers a surface of a part of the active layers 2a and is located between parts of adjacent ones of the active structures 2 in a same layer and between parts of adjacent ones of the active groups; and word lines 51, wherein each of the word lines 51 is located between parts of the adjacent ones of the active layers 2a in the active group, and each of the word lines 51 crosses a plurality of active structures 2 located in the same layer.

That is, the two active structures 2 formed by the active group and a part of the first dielectric layer 31 and the word line 51 that are located therebetween can be used to form a transistor. The part of the first dielectric layer 31 located between adjacent transistors are used to isolate the transistors.

Referring to FIG. 22, the semiconductor structure further includes: an insulating layer 61 located on a sidewall of the word line region A2 close to the capacitor region A3; a capacitor hole 71 enclosed with a part of the active structures 2 formed in a same active group, a part of the isolation layers 4, and a part of the insulating layer 61; a bottom electrode 721 located on an inner wall of the capacitor hole 71; a capacitor dielectric layer 73 located on a surface of the bottom electrode 721; a top electrode 74 located on a surface of the capacitor dielectric layer 73, wherein top electrodes 74 located in different capacitor holes 71 are interconnected; wherein the bottom electrode 721, the capacitor dielectric layer 73, and the top electrode 74 form a capacitor 70; and a filling layer 722 located between parts of the adjacent ones of the active groups and between parts of adjacent ones of the isolation layers 4.

That is, the capacitor 70 is formed between parts of the two layers of active structures 2 in the active group, thereby helping increase a contact area between the capacitor 70 and the active structures 2 and reducing a contact resistance.

Referring to FIG. 15, the semiconductor structure further includes a step region B1, wherein the step region B1 is located in a second direction Y of the word line region A2 and is connected to the word line region A2; the second direction Y is perpendicular to the first direction X; the active layers 2a, the first dielectric layer 31, and the word lines 51 are further located in the step region B1; the step region B1 includes a plurality of steps, and a part of the active layers 2a in the active group, a part of the first dielectric layer 31, and a part of the word line 51 are used to form the corresponding step; in a direction that the word line region A2 points to the step region B1, heights of the plurality of steps are sequentially reduced; and connecting pillars 52, wherein the connecting pillars 52 are in a one-to-one correspondence with the steps and are connected to the word lines 51 in a one-to-one correspondence.

That is, the steps can provide spatial locations for the connecting pillars 52, such that a plurality of layers of word lines 51 can be drawn out to facilitate connection of the word lines 51 to a peripheral circuit.

In this specification, the description of terms such as "some embodiments" and "for example" means that specific features, structures, materials, or characteristics described in combination with the embodiments or example are included in at least one embodiment or example of the present disclosure. In this specification, the illustrative expressions of the above terms do not necessarily refer to a same embodiment or example. Furthermore, the specific features, structures, materials, or characteristics described may be combined in a suitable manner in any one or more of embodiments or examples. In addition, those skilled in the art may combine different embodiments or examples described in this specification and characteristics of the different embodiments or examples without mutual contradiction.

Although the embodiments of the present disclosure have been illustrated and described, it may be understood that the foregoing embodiments are examples instead of limitations to the present disclosure. Those of ordinary skill in the art can make various changes, modifications, replacements, and variations on the foregoing embodiments within the scope of the present disclosure. Therefore, any changes or modifications made according to the claims and descriptions of the present disclosure should fall within the scope of the present disclosure.

The invention claimed is:

1. A method of manufacturing a semiconductor structure, wherein the semiconductor structure comprises a bit line region, a word line region, and a capacitor region that are arranged in sequence in a first direction, and the method of manufacturing comprises:

providing a base, and forming a plurality of active layers and a plurality of sacrificial layers on a part of the base in the bit line region, the word line region, and the capacitor region, wherein the active layers and the sacrificial layers are alternately stacked; two adjacent ones of the active layers constitute an active group; and there is a first distance between the active layers in the active group, there is a second distance between adjacent ones of active groups, and the first distance is greater than the second distance;

forming a plurality of isolation layers, wherein each of the isolation layers penetrates through all the active layers and all the sacrificial layers, and the isolation layers divide each of the active layers into a plurality of active structures, and each of the isolation layers extends along the first direction;

removing a part of the isolation layers located in the word line region and a part of the sacrificial layers located in the word line region;

forming a first dielectric layer in the word line region, wherein the first dielectric layer covers a surface of a part of the active layers and is located between parts of adjacent ones of the active structures in a same layer and between parts of adjacent ones of the active groups; and forming a plurality of word lines in the word line region, wherein each of the word lines is located between parts of the active layers in the active group, and each of the word lines crosses a plurality of active structures located in a same layer.

2. The method of manufacturing a semiconductor structure according to claim 1, wherein a ratio of the first distance to the second distance is 1.8 to 3.5; and a ratio of the second distance to a width of the isolation layer is 0.8 to 1.2.

3. The method of manufacturing a semiconductor structure according to claim 2, wherein the first distance is 15 nm to 30 nm; and the second distance is 8 nm to 14 nm.

4. The method of manufacturing a semiconductor structure according to claim 1, further comprising:
   forming an insulating layer on a sidewall of the word line region close to the capacitor region;
   removing a part of the sacrificial layers located in the capacitor region to expose the insulating layer, wherein a part of the active structures formed in a same active group, a part of the isolation layers, and a part of the insulating layer enclose a capacitor hole;
   forming a bottom electrode on an inner wall of the capacitor hole, and forming a filling layer between parts of the adjacent ones of the active groups;
   forming a capacitor dielectric layer on a surface of the bottom electrode; and
   forming a top electrode on a surface of the capacitor dielectric layer, wherein top electrodes located in different capacitor holes are interconnected.

5. The method of manufacturing a semiconductor structure according to claim 4, wherein the forming a bottom electrode and the forming a filling layer comprise:
   forming an initial bottom electrode in the capacitor region, wherein the initial bottom electrode is located on a surface of a part of the active structures, a surface of a part of the insulating layer, and a surface of a part of the isolation layers and fills between the parts of the adjacent ones of the active groups; and
   removing a part of the initial bottom electrode located on an end face, away from the word line region, of a part of the active structures located in the capacitor region; and using a part of the initial bottom electrode that fills between the parts of the adjacent ones of the active groups as the filling layer, and using a part of the initial bottom electrode located in the capacitor hole as the bottom electrode.

6. The method of manufacturing a semiconductor structure according to claim 5, wherein the removing a part of the initial bottom electrode located on an end face comprises:
   filling the capacitor hole with a capacitor-protection layer, wherein the capacitor-protection layer covers a part of the initial bottom electrode located on the inner wall and exposes the part of the initial bottom electrode located on the end face;
   removing the part of the initial bottom electrode located on the end face by using a wet etching process; and
   removing the capacitor-protection layer.

7. The method of manufacturing a semiconductor structure according to claim 1, wherein the semiconductor structure further comprises a step region, and the step region is located in a second direction of the word line region and is connected to the word line region; and the second direction is perpendicular to the first direction;
   the active layers and the sacrificial layers are further located in the step region; and
   the removing a part of the isolation layers located in the word line region and a part of the sacrificial layers located in the word line region further comprises:
   removing a part of the sacrificial layers located in the step region, wherein
   the first dielectric layer and the word lines are further located in the step region;
   after forming the word lines, patterning the step region to form a plurality of steps, wherein a part of the active layers in a same active group, a part of the first dielectric layer, and a part of the word line are used to form a corresponding step; and in a direction that the word line region points to the step region, heights of the plurality of steps are sequentially reduced; and
   forming a plurality of connecting pillars, wherein the connecting pillars are in a one-to-one correspondence with the steps and are connected to the word lines in a one-to-one correspondence.

8. The method of manufacturing a semiconductor structure according to claim 7, wherein the semiconductor structure further comprises an initial step region, and the initial step region is located in the second direction of the bit line region, the word line region, and the capacitor region; and
   before forming the steps, the method of manufacturing further comprises: patterning the initial step region to form the step region.

9. The method of manufacturing a semiconductor structure according to claim 7, wherein the forming a plurality of connecting pillars comprises:
   forming a filling dielectric layer, wherein the filling dielectric layer covers the steps in the step region;
   forming a plurality of through holes in the filling dielectric layer, wherein the plurality of through holes are in a one-to-one correspondence with the steps, and the through hole further penetrates through a part of the active structure and a part of the first dielectric layer that are located in an upper part and that correspond to the step and exposes a part of an upper surface of a part of the word line; and
   forming the connecting pillar that fills the through hole.

10. The method of manufacturing a semiconductor structure according to claim 9, after forming the steps and before the forming a filling dielectric layer, the method of manufacturing further comprises:
    forming a protective layer that covers a surface of the steps, wherein
    the through hole further penetrates through the protective layer.

11. The method of manufacturing a semiconductor structure according to claim 1, after the forming a first dielectric layer, the method of manufacturing further comprises:
    forming a second dielectric layer, wherein the second dielectric layer covers a surface of the first dielectric layer and is located between the first dielectric layer and the word lines; and
    a dielectric constant of the second dielectric layer is greater than a dielectric constant of the first dielectric layer.

12. The method of manufacturing a semiconductor structure according to claim 1, after forming the isolation layers, the method of manufacturing further comprises:
    removing a part of the sacrificial layers located in the bit line region;
    forming a bit line conductive layer in the bit line region, wherein the bit line conductive layer is located between parts of the active structures in a same active group and between parts of the adjacent ones of the active groups, and is further located between parts of adjacent ones of the isolation layers; and
    forming a plurality of bit lines that are arranged at intervals in the bit line region, wherein an extension direction of each of the bit lines is perpendicular to a surface of the base, and the bit line is connected to an end face, away from the word line region, of a part of a corresponding active structure located in the bit line region.

13. A semiconductor structure, comprising a bit line region, a word line region, and a capacitor region arranged in sequence in a first direction, further comprising:
  a base;
  a plurality of active layers that are arranged at intervals stacked on a part of the base in the bit line region, the word line region, and the capacitor region, wherein two adjacent ones of the active layers constitute an active group, there is a first distance between the active layers in the active group, there is a second distance between adjacent ones of active groups, and the first distance is greater than the second distance;
  a plurality of isolation layers, wherein each of the isolation layers penetrates through all the active layers, and the isolation layers divide each of the active layers into a plurality of active structures, and each of the isolation layers extends along the first direction;
  a first dielectric layer, wherein the first dielectric layer covers a surface of a part of the active layers and is located between parts of adjacent ones of the active structures in a same layer and between parts of adjacent ones of the active groups; and
  word lines, wherein each of the word lines is located between parts of the adjacent ones of the active layers in the active group, and each of the word lines crosses a plurality of active structures located in a same layer.

14. The semiconductor structure according to claim 13, further comprising: an insulating layer, located on a sidewall of the word line region close to the capacitor region;
  a capacitor hole, enclosed with a part of the active structures formed in a same active group, a part of the isolation layers, and a part of the insulating layer;
  a bottom electrode, located on an inner wall of the capacitor hole;
  a capacitor dielectric layer, located on a surface of the bottom electrode;
  a top electrode, located on a surface of the capacitor dielectric layer, wherein top electrodes located in different capacitor holes are interconnected;
  wherein the bottom electrode, the capacitor dielectric layer, and the top electrode form a capacitor; and
  a filling layer, located between parts of the adjacent ones of the active groups and between parts of adjacent ones of the isolation layers.

15. The semiconductor structure according to claim 13, further comprising: a step region, wherein the step region is located in a second direction of the word line region and is connected to the word line region; and the second direction is perpendicular to the first direction;
  the active layers, the first dielectric layer, and the word lines are further located in the step region; and
  the step region comprises a plurality of steps, and a part of the active layers in a same active group, a part of the first dielectric layer, and a part of the word line are used to form a corresponding step; and in a direction that the word line region points to the step region, heights of the plurality of steps are sequentially reduced; and
  connecting pillars, wherein the connecting pillars are in a one-to-one correspondence with the steps and are connected to the word lines in a one-to-one correspondence.

* * * * *